US009633844B2

(12) United States Patent
Tian et al.

(10) Patent No.: US 9,633,844 B2
(45) Date of Patent: Apr. 25, 2017

(54) METHOD FOR FORMING LOW TEMPERATURE POLYSILICON THIN FILM

(71) Applicant: BOE TECHNOLOGY GROUP CO., LTD., Beijing (CN)

(72) Inventors: Xueyan Tian, Beijing (CN); Chunping Long, Beijing (CN); Jiangfeng Yao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 13/703,122

(22) PCT Filed: Oct. 22, 2012

(86) PCT No.: PCT/CN2012/083331
§ 371 (c)(1),
(2) Date: Dec. 10, 2012

(87) PCT Pub. No.: WO2013/071811
PCT Pub. Date: May 23, 2013

(65) Prior Publication Data
US 2014/0057419 A1     Feb. 27, 2014

(30) Foreign Application Priority Data
Nov. 18, 2011   (CN) .......................... 2011 1 0370014

(51) Int. Cl.
*H01L 21/20* (2006.01)
*H01L 21/36* (2006.01)
(Continued)

(52) U.S. Cl.
CPC .. *H01L 21/02675* (2013.01); *H01L 21/02436* (2013.01); *H01L 21/02532* (2013.01);
(Continued)

(58) Field of Classification Search
CPC ......... H01L 21/02068; H01L 21/12257; H01L 23/53271; H01L 29/4916
(Continued)

(56) References Cited

U.S. PATENT DOCUMENTS 6,294,219 B1    9/2001  Tsai et al.
6,482,682 B2 *  11/2002  Sun ................... H01L 29/66757
                                                        257/E21.413
(Continued)

FOREIGN PATENT DOCUMENTS

CN    1292040 A    4/2001
CN    1395287 A    2/2003
(Continued)

OTHER PUBLICATIONS

Second Chinese Office Action Appln. No. 201110370014.9; Dated Sep. 10, 2014.
(Continued)

*Primary Examiner* — Telly Green
(74) *Attorney, Agent, or Firm* — Ladas & Parry LLP

(57) ABSTRACT

Embodiments of the present invention provide a method for forming a low temperature polysilicon thin film. The method for forming the low temperature polysilicon thin film can include: depositing a buffer layer and an amorphous silicon layer on a substrate in this order; heating the amorphous silicon layer; performing an excimer laser annealing process on the amorphous silicon layer to form a polysilicon layer; oxidizing partially the polysilicon layer so as to form an oxidation portion at an upper portion of the polysilicon layer; and removing the oxidation portion of the polysilicon layer to form a polysilicon thin film.

10 Claims, 2 Drawing Sheets

(51) Int. Cl.
  *H01L 21/02* (2006.01)
  *H01L 27/12* (2006.01)
  *H01L 21/321* (2006.01)

(52) U.S. Cl.
  CPC .. *H01L 21/02595* (2013.01); *H01L 21/02664* (2013.01); *H01L 21/02686* (2013.01); *H01L 27/1285* (2013.01); *H01L 21/32115* (2013.01)

(58) Field of Classification Search
  USPC .................................................. 438/487
  See application file for complete search history.

(56) References Cited

U.S. PATENT DOCUMENTS

| | | | | |
|---|---|---|---|---|
| 6,677,222 | B1* | 1/2004 | Mishima | H01L 21/2022 |
| | | | | 117/37 |
| 7,015,122 | B2* | 3/2006 | Lee | 438/486 |
| 7,026,226 | B1* | 4/2006 | Lin | 438/474 |
| 7,306,980 | B2* | 12/2007 | Takehashi | H01L 29/66757 |
| | | | | 257/E21.413 |
| 7,335,540 | B2* | 2/2008 | Peng et al. | 438/166 |
| 7,666,726 | B2* | 2/2010 | Utsunomiya et al. | 438/166 |
| 2003/0015706 | A1 | 1/2003 | Morimoto | |
| 2003/0045038 | A1* | 3/2003 | Lin | H01L 29/6675 |
| | | | | 438/166 |
| 2003/0153110 | A1* | 8/2003 | Hotta et al. | 438/30 |
| 2004/0140469 | A1* | 7/2004 | Liao | G02F 1/136277 |
| | | | | 257/72 |
| 2004/0229415 | A1* | 11/2004 | Takehashi | H01L 29/66757 |
| | | | | 438/163 |
| 2005/0141580 | A1* | 6/2005 | Partlo et al. | 372/55 |
| 2005/0181566 | A1* | 8/2005 | Machida | H01L 29/66757 |
| | | | | 438/301 |
| 2005/0211983 | A1* | 9/2005 | Kaitoh | G02F 1/136213 |
| | | | | 257/66 |
| 2005/0285112 | A1* | 12/2005 | Hwang | H01L 29/66757 |
| | | | | 257/66 |
| 2006/0043072 | A1* | 3/2006 | Chen et al. | 216/88 |
| 2006/0043367 | A1* | 3/2006 | Chang et al. | 257/66 |
| 2006/0121659 | A1* | 6/2006 | Chang | H01L 29/66757 |
| | | | | 438/197 |
| 2009/0242957 | A1* | 10/2009 | Ma | H01L 21/28273 |
| | | | | 257/316 |
| 2011/0063339 | A1* | 3/2011 | Umezaki et al. | 345/690 |
| 2014/0000686 | A1* | 1/2014 | Mungekar et al. | 136/252 |

FOREIGN PATENT DOCUMENTS

| | | |
|---|---|---|
| CN | 1635610 A | 7/2005 |
| CN | 102655089 A | 9/2012 |
| JP | 11-067758 A | 3/1999 |

OTHER PUBLICATIONS

First Chinese Office Action dated Jan. 22, 2014; Appln. No. 201110370014.9.
International Search Report mailed Jan. 24, 2013; PCT/CN2012/083331.
International Preliminary Report on Patentability dated May 20, 2014; PCT/CN2012/083331.
Chinese Rejection Decision Appln. No. 201110201850.4; Dated Aug. 27, 2014.
Third Chinese Office Action Appln. No. 201110370014.9; Dated Feb. 5, 2015.

\* cited by examiner

METHOD FOR FORMING LOW TEMPERATURE POLYSILICON THIN FILM

TECHNICAL FIELD

An embodiment of the present invention relates to a method for forming a low temperature polysilicon thin film.

BACKGROUND

In general, during manufacturing a liquid crystal display device, a polysilicon thin film is used to form an active layer of a thin film transistor in an array substrate. However, since a typical base substrate has a low heat resistance, if the polysilicon thin film is formed at a high temperature directly, the base substrate may be deformed. Therefore, a low temperature polysilicon thin film is used generally in forming the active layer of the thin film transistor.

An excimer laser annealing (ELA) method is one of the most popular methods for forming a low temperature polysilicon thin film for mass production, in which an excimer laser with a high energy is used to irradiate the amorphous silicon thin film, and the amorphous silicon is melted by absorbing the energy of the excimer laser and then is crystallized to form a polysilicon thin film after cooling, which is performed entirely at a temperature from 500° C. to 600° C. The ELA method is performed by scanning the amorphous silicon layer with a pulse laser of the excimer laser generator to form an irradiated region, and further forming a plurality of irradiated regions which overlap each other by moving the pulse laser forward at a certain interval in scanning. Since the overlapped portion has a higher temperature than that of the non-overlapped portion, a heterogeneous nucleation may occur at a boundary between the overlapped portion and the non-overlapped portion. The overlapped portion and the non-overlapped portion may generate a lateral temperature gradient, so the crystal core will grow in a direction in which the temperature is increased, that is, in a direction from the non-overlapped portion to the overlapped portion, and is crystallized to form a low temperature polysilicon thin film finally.

For example, as shown in FIG. 1, a buffer layer 106 is formed on a substrate 101, and an amorphous silicon layer is formed on the buffer layer 106. The amorphous silicon layer is crystallized to form a polysilicon layer 105 after performing an ELA process. However, the inventors have found that, since the ELA process is complicated, the amorphous silicon layer can not be crystallized totally to form a polysilicon layer, so that the formed polysilicon layer 105 has an uneven surface with a plurality of projection portions 104 formed thereon. When the thin film transistor is applied a voltage, the projection portions on the surface of the polysilicon thin film may result in a point discharge phenomenon, so the leakage current is increased. Furthermore, since the polysilicon thin film has an uneven surface and thus has large resistance, the mobility and the threshold voltage of the polysilicon thin film are not uniform, and the product quality is adversely affected.

SUMMARY

In an embodiment of the present invention, a method for forming a low temperature polysilicon thin film is provided, and the method comprises: depositing a buffer layer and an amorphous silicon layer sequentially on a substrate; heating the amorphous silicon layer; performing an excimer laser annealing process on the amorphous silicon layer to form a polysilicon layer; oxidizing partially the polysilicon layer so as to form an oxidation portion at an upper portion of the polysilicon layer; and removing the oxidation portion of the polysilicon layer to form a polysilicon thin film.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION OF EMBODIMENTS

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

In an embodiment of the present invention, a method for forming a low temperature polysilicon thin film is provided to form a low temperature polysilicon thin film having a flat surface to reduce the leakage current generated during operation of the polysilicon thin film and improve the product quality.

Figure 1:
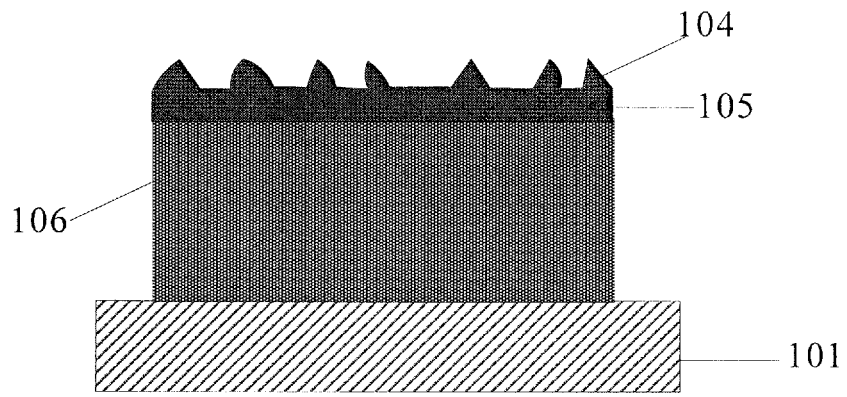
FIG. 1 is a schematic diagram showing a structure of a low temperature polysilicon thin film formed by the ELA method in the prior art.
Figure 2:
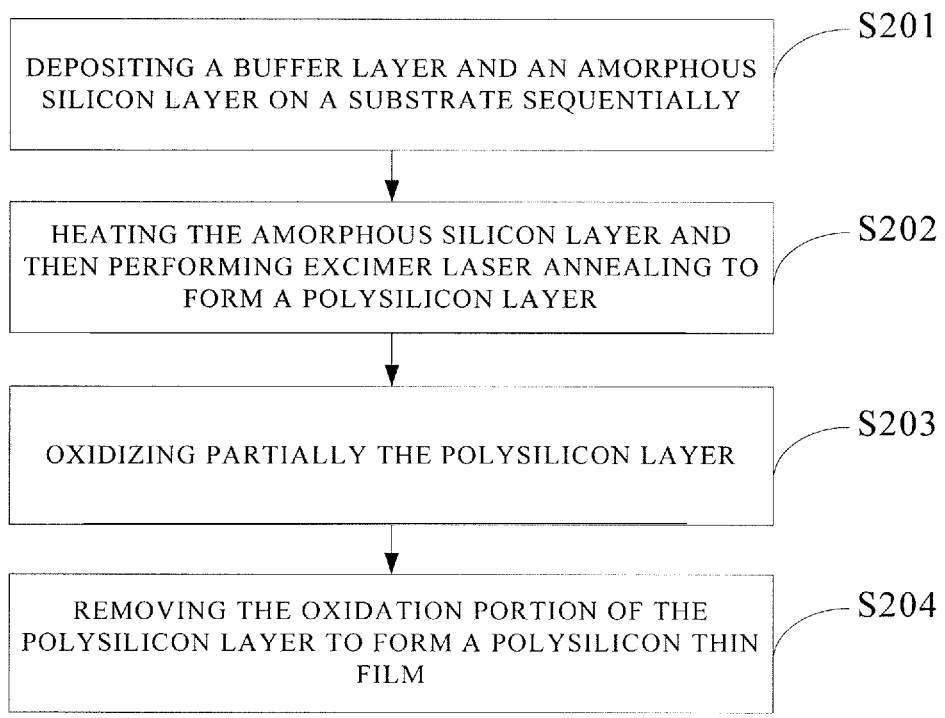
FIG. 2 is a flow chart showing a method for forming a low temperature polysilicon thin film provided in an embodiment of the present invention.
Figure 3:
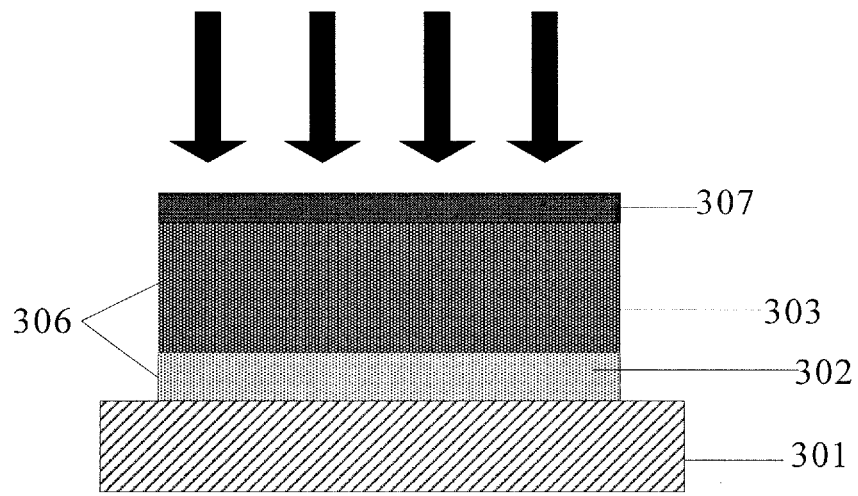
FIG. 3 is a schematic diagram showing a structure of a substrate during performing the ELA process in the method for forming the low temperature polysilicon thin film provided in the embodiment of the present invention.
Figure 4:
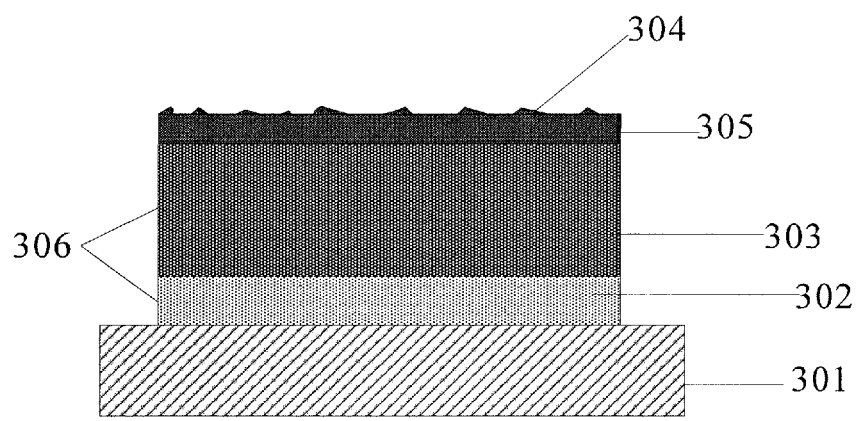
FIG. 4 is a schematic diagram showing a structure of the substrate after performing an etching process in the method for forming the low temperature polysilicon thin film provided in the embodiment of the present invention.

The method for forming the low temperature polysilicon thin film provided in the embodiment of the present invention will be described in the following with reference to FIGS. 2 to 4. FIG. 2 is a flow chart showing a method for forming a low temperature polysilicon thin film provided in an embodiment of the present invention. FIG. 3 is a schematic diagram showing a structure of a substrate during performing an ELA process in the method for forming the low temperature polysilicon thin film provided in the embodiment of the present invention. FIG. 4 is a schematic diagram showing a structure of the substrate after performing an etching process in the method for forming the low temperature polysilicon thin film provided in the embodiment of the present invention. As shown in FIG. 2, the method for forming the low temperature polysilicon thin film provided in the embodiment of the present invention can comprise, for example, the following steps.

S201: a buffer layer and an amorphous silicon layer are deposited sequentially on a substrate.

In the embodiments of the present invention, as shown in FIG. 3, a buffer layer 306 and an amorphous silicon layer 307 are deposited on a cleaned base substrate 301.

In this embodiment, for example, the buffer layer 306 has a dual-layer structure including a silicon nitride (SiN$_x$) layer 302 and a silicon dioxide (SiO$_2$) layer 303, and can prevent impurities in the base substrate 301 from diffusing upward in subsequent processes, which otherwise will affect the quality of the low temperature polysilicon thin film to be formed later. In some embodiments of the present invention, the buffer layer 306 may also have a single-layer structure including only a silicon nitride (SiNx) layer, a silicon dioxide (SiO2) layer or a silicon oxynitride (SiON) layer, but the embodiments of the present invention are not limited thereto.

In this embodiment, for example, the silicon nitride layer 302 which is deposited firstly has a thickness from 50 nm to 150 nm, and the silicon dioxide layer 303 which is deposited later has a thickness from 100 nm to 350 nm, but the embodiments of the present invention are not limited thereto.

In this embodiment, for example, the buffer layer 306 and the amorphous silicon layer 307 may be formed by a plasma enhanced chemical vapor deposition (PECVD) method. In some embodiments of the present invention, the buffer layer 306 and the amorphous silicon layer 307 can be formed by sputtering, vacuum evaporation deposition, low pressure chemical vapor deposition and the like.

S202: the amorphous silicon layer is heated and then an ELA process is performed on the amorphous silicon layer so as to form a polysilicon layer.

In the embodiments of the present invention, as shown in FIG. 3, the amorphous silicon layer 307 is heated at a temperature from 400 to 500° C. for 0.5 to 3 hours, and then an ELA process is performed on the heated amorphous silicon layer so as to form a polysilicon layer.

In this embodiment, the ELA process is performed by using e.g. an xenon chloride (XeCl) excimer laser device (which has a wave length of 308 nm), in which the laser pulse has a frequency of 300 Hz, an overlapping ratio is between 92% and 98%, and the laser has an energy density between 300 to 500 mJ/cm$^2$, so that the amorphous silicon layer is crystallized to form a polysilicon layer. In some embodiments of the present invention, the ELA process can be performed by using a krypton chloride (KrF) excimer laser device, an argon chloride (ArF) excimer laser device and the like, but the embodiments of the present invention are not limited thereto.

After performing the ELA process, a polysilicon layer is formed from the amorphous silicon layer. However, the polysilicon layer has a surface with a plurality of projection portions formed by the non-crystallized amorphous silicon, and these projection portions will be removed by subsequent processes.

S302: the polysilicon layer is oxidized partially.

In the embodiments of the present invention, the polysilicon layer is oxidized partially so that the amorphous silicon layer on the surface of the polysilicon layer is oxidized into silicon dioxide and an oxide portion is formed at an upper portion of the polysilicon layer.

In this embodiment, the base substrate 301 is placed into a rapid thermal annealing apparatus at a temperature of 700° C. in an atmosphere of oxygen gas (O$_2$) to perform a rapid thermal annealing process and oxidize the non-crystallized amorphous silicon into silicon dioxide.

In the other embodiments of the present invention, the polysilicon layer can be oxidized in an atmosphere of nitrous oxide (N$_2$O) plasma to oxidize the non-crystallized amorphous silicon into silicon dioxide. For example, the above oxidation process can be performed in e.g., a PECVD vapor deposition apparatus with a temperature in the PECVD vapor deposition apparatus over 400° C., a flow rate of the reactive gas from 1000 to 2000 sccm, a radio-frequency power of 700 W, a pressure in a deposition chamber from 1500 to 3000 mtorr and an oxidation duration from 2 to 7 minutes.

S204: the oxidation portion of the polysilicon layer is removed so as to form a polysilicon thin film.

In the embodiments of the present invention, as shown in FIG. 4, the oxidation portion of the polysilicon layer is removed by e.g. etching so as to form a polysilicon thin film 305 having a flat surface.

In this embodiment, the oxidation portion of the polysilicon layer can be etched with e.g., a hydrofluoric acid solution of a concentration from 1% to 10%. The oxidation portion of the polysilicon layer is formed by silicon dioxide, which can react with the hydrofluoric acid, and the reaction can be expressed by a chemical formula as follows:

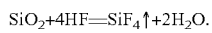

$$SiO_2 + 4HF = SiF_4\uparrow + 2H_2O.$$

Therefore, the oxidation portion of the polysilicon layer can be removed so as to form a polysilicon thin film having a flat surface.

As compared with the prior art, the polysilicon thin film formed by the method provided in the embodiments of the present invention has a flat surface, so that the point discharging phenomenon due to the projection portions can be prevented, and thus the leakage current can be prevented from being generated.

In the method for forming the low temperature polysilicon thin film provided in the embodiments of the present invention, since the polysilicon layer formed after performing an ELA process is oxidized and etched, it is possible to form a polysilicon thin film having a flat surface to reduce the leakage current generated during using the polysilicon thin film and improve the product quality.

It should be appreciated that the embodiments described above are intended to illustrate but not limit the present invention. Although the present invention has been described in detail herein with reference to the above embodiments, it should be understood by those skilled in the art that the present invention can be modified and some of the technical features can be equivalently substituted without departing from the spirit and scope of the present invention.

The invention claimed is:

1. A method for forming a low temperature polysilicon thin film comprising:
   depositing a buffer layer and an amorphous silicon layer sequentially on a substrate;
   heating the amorphous silicon layer, and then performing an excimer laser annealing process on the amorphous silicon layer to form a polysilicon layer;
   oxidizing partially the polysilicon layer so as to form an oxidation portion at an upper portion of the polysilicon layer; and
   removing the oxidation portion of the polysilicon layer to form a polysilicon thin film;
   wherein oxidizing partially of the polysilicon layer comprises oxidizing partially the polysilicon layer with nitrous oxide plasma, and oxidizing is performed under conditions comprising a temperature higher than 400° C., a flow rate of reactive gas from 1000 to 2000 sccm, a radio-frequency power of 700 W, a pressure in a deposition chamber from 1500 to 3000 mtorr, and an oxidation duration from 2 to 7 minutes.

2. The method for forming the low temperature polysilicon thin film according to claim 1, wherein depositing the buffer layer comprises depositing a silicon nitride layer having a thickness from 50 to 150 nm and a silicon dioxide layer having a thickness from 100 nm to 350 nm sequentially.

3. The method for forming the low temperature polysilicon thin film according to claim 1, wherein the amorphous silicon layer has a thickness from 30 to 100 nm.

4. The method for forming the low temperature polysilicon thin film according to claim 1, wherein heating the amorphous silicon layer comprises heating the amorphous silicon layer at a temperature from 400 to 500° C. for 0.5 to 3 hours.

5. The method for forming the low temperature polysilicon thin film according to claim 1, wherein performing the excimer laser annealing (ELA) process on the amorphous silicon layer comprises:
    performing the ELA process to the amorphous silicon layer by using a xenon chloride excimer layer device, wherein laser pulse has a frequency of 300 Hz, an overlapping ratio of between 92% and 98%, and a laser energy density between 300 to 500 mJ/cm$^2$.

6. The method for forming the low temperature polysilicon thin film according to claim 1, wherein oxidizing partially of the polysilicon layer comprises oxidizing partially the polysilicon layer by using oxygen gas.

7. The method for forming the low temperature polysilicon thin film according to claim 6, wherein the polysilicon layer is oxidized partially at a temperature of 700° C. in a atmosphere of oxygen gas.

8. The method for forming the low temperature polysilicon thin film according to claim 1, wherein removing the oxidation portion of the polysilicon layer comprises removing the oxidation portion of the polysilicon layer by dry etching.

9. The method for forming the low temperature polysilicon thin film according to claim 1, wherein removing the oxidation portion of the polysilicon layer comprises removing the oxidation portion of the polysilicon layer by wet etching.

10. The method for forming the low temperature polysilicon thin film according to claim 9, wherein the oxidation portion of the polysilicon layer is etched by using a hydrofluoric acid solution with a concentration from 1% to 10%.

* * * * *